US008200467B1

(12) United States Patent
Cai et al.

(10) Patent No.: US 8,200,467 B1
(45) Date of Patent: Jun. 12, 2012

(54) ADAPTIVE SOLVER FOR CYCLIC BEHAVIOR OF A CIRCUIT

(75) Inventors: Qian Cai, Stewartsville, NJ (US); Baolin Yang, Fremont, CA (US); Bruce W. McGaughy, Fremont, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 996 days.

(21) Appl. No.: 11/756,410

(22) Filed: May 31, 2007

(51) Int. Cl.
*G06G 7/62* (2006.01)
*G06F 17/50* (2006.01)
(52) U.S. Cl. ............................. 703/13; 703/14
(58) Field of Classification Search ............. 703/13, 703/14
See application file for complete search history.

(56) References Cited

U.S. PATENT DOCUMENTS

| 5,588,142 A * | 12/1996 | Sharrit ............................ 703/14 |
| 5,995,733 A * | 11/1999 | Roychowdhury ................ 716/6 |
| 2009/0326882 A1* | 12/2009 | Fang .................................. 703/2 |

OTHER PUBLICATIONS

Agilent Technologies, "Circuit Envelope Simulation", Agilent Technologies, Sep. 2004, 50 pages.*
Agilent Technologies, "Harmonic Balance Simulation", Agilent Technologies, Sep. 2004, 202 pages.*
Pascual JP, "System Simulation of a Differential Radiometer Using Standard RF-Microwave Simulations", Nov. 2005, Simulations vol. 81 Issue 11 21 pages.*
Agilent, "DC Simulation" Aug. 2005, http://cp.literature.agilent.com/litweb/pdf/ads2005a/pdf/cktsimdc.pdf.*
Mayaram, K.M., et al., "Computer-Aided Circuit Analysis Tools for RFIC Simulation: Algorithms, Features, and Limitations;" IEEE Trans. Circuits and Systems, vol. 47, Apr. 2000, pp. 274-286.
Kundert, K.S., "Introduction to RF Simulation and its Application;" IEEE J. Solid-State Circuits, vol. 34, Sep. 1999, pp. 1298-1319.
Passinsky, A. et al., "Envelope Transient Analysis: Key to First-Pass Successful Wireless Systems and IC Design;" Wireless Symposium, Spring 2000.
Rizzoli, V., et al., "A Modulation-Oriented Piecewise Harmonic-Balance Technique Suitable for Transient Analysis and Digitally Modulated Signals;" Proc. 26th Microwave Conf., Prague, Czech Republic, Sep. 1996, pp. 546-550.

(Continued)

*Primary Examiner* — David Silver
(74) *Attorney, Agent, or Firm* — Schwegman, Lundberg & Woessner, P.A.

(57) ABSTRACT

A method of determining values for a circuit over a cycle includes: specifying first-cycle values for the circuit in a first cycle, the first-cycle values including voltage or current values for the circuit and providing reference cyclic values for characterizing a cyclic behavior of the circuit in the first cycle with a reference cyclic dimension; determining, from the first-cycle values, path-following values for the circuit in a second cycle, wherein the path-following values include transient values for characterizing a transient behavior of the circuit and cyclic-correction values for characterizing the cyclic behavior of the circuit relative to the reference cyclic values from the first cycle, wherein a cyclic-correction dimension of the cyclic-correction values is less than the reference cyclic dimension; and saving at least some values based on the path-following values in the second cycle.

23 Claims, 6 Drawing Sheets

OTHER PUBLICATIONS

Feldman, P. et al., "Computation of Circuit Waveform Envelopes Using an Efficient, Matrix-Decomposed Harmonic Balance Algorithm," IEEE Int. Conf. Computer-Aided Design Dig. Tech. Papers, Nov. 1996.

Petzold, L., "An Efficient Numerical Method for Highly Oscillatory Ordinary Differential Equations;" SIAM J. Numer. Anal., vol. 18, pp. 455-479, Jun. 1981.

Kundert, K. et al., "An Envelope-Following Method for the Efficient Transient Simulation of Switching Power and Filter Circuits;" IEEE Int. Conf. Computer-Aided Design Dig. Tech. Papers, Nov. 1998.

Yang, B. et al., "A Multi-Interval Chebyshev Collocation Method for Efficient High-Accuracy RF Circuit Simulation," Proc. 37th Design Automation Conf., Jun. 2000, pp. 178-183.

* cited by examiner

US 8,200,467 B1

ADAPTIVE SOLVER FOR CYCLIC BEHAVIOR OF A CIRCUIT

BACKGROUND OF THE INVENTION

1. Field of Invention

The present invention relates to circuits generally and more particularly to simulating circuits with cyclic or periodic behavior.

2. Description of Related Art

With the advances of semiconductor and integrated circuit (IC) design technologies and the increasing demands of the corresponding markets, system-on-chip (SoC) ICs with digital and analog contents on one chip have become an important part of the electronics industry. As a result, SoC designs, productions and shipments have grown significantly each year. In this environment SoC business success requires a first-to-market delivery that depends on successful first-pass designs and short design cycles. Efficient and accurate EDA tools are the keys to the success of SoC design.

There are substantial challenges to efficiently and accurately simulate SoC ICs due to analog content generally and especially the RF (radio frequency) components such as amplifiers, receivers and transceivers where modulated signals are present. The conventional transient analysis is relatively inefficient due to the widely separated spectral components where the high frequency limits the time steps while the low frequency requires long time duration. In some applications, envelope-following simulators have become the basic tools for generating first-pass successful wireless system and RFIC designs [1-3]. The conventional envelope simulation algorithms are modulated-oriented harmonic balance (MOHB) based on harmonic balance technique [4-6] and transient envelope following (TEF) based on shooting Newton methods [7-8]. Both MOHB and TEF require two loops in the envelope simulation and suffer from limited capacity.

There is inherently a tradeoff between speed and accuracy however. In many operational settings envelope following methods cannot achieve the accuracy that can be obtained by the conventional transient analysis. Thus, there is a need for improved methods for simulating circuits with cyclic behavior including circuits with widely separated spectral components.

SUMMARY OF THE INVENTION

In one embodiment of the present invention, a method of determining values for a circuit over a cycle includes: specifying first-cycle values for the circuit in a first cycle, the first-cycle values including voltage or current values for the circuit and providing reference cyclic values for characterizing a cyclic behavior of the circuit in the first cycle with a reference cyclic dimension; determining, from the first-cycle values, path-following values for the circuit in a second cycle, wherein the path-following values include transient values for characterizing a transient behavior of the circuit and cyclic-correction values for characterizing the cyclic behavior of the circuit relative to the reference cyclic values from the first cycle, wherein a cyclic-correction dimension of the cyclic-correction values is less than the reference cyclic dimension; and saving at least some values based on the path-following values in the second cycle.

According to one aspect, the method may further include: determining, from the first-cycle values in the first cycle, envelope values for the circuit in the second cycle, wherein the envelope values characterize the transient behavior of the circuit relative to the reference cyclic values from the first cycle; and estimating an accuracy of the envelope values and specifying the cyclic-correction dimension for improved accuracy of the path-following values relative to the envelope values in the second cycle.

According to another aspect, the path-following values are first path-following values, the transient values are first transient values, the cyclic-correction values are first cyclic-correction values, and the cyclic-correction dimension is a first cyclic-correction dimension, and the method may further include: estimating an accuracy of the first path-following values and specifying a second cyclic-correction dimension for corresponding second cyclic-correction values, wherein the second cyclic-correction dimension is greater than the first cyclic-correction dimension for improved accuracy in the second cycle; and determining, from the first-cycle values, second path-following values for the circuit in the second cycle, wherein the second path-following values include second transient values for characterizing the transient behavior of the circuit and the second cyclic-correction values for characterizing the cyclic behavior of the circuit relative to the reference cyclic values from the first cycle.

According to another aspect, the method may further include: a step for specifying the cyclic-correction dimension to improve an accuracy of the path-following values in the second cycle relative to an envelope approximation that is based on the reference cyclic values from the first cycle.

According to another aspect, the method may further include: estimating an accuracy of the path-following values in the second cycle by calculating an error in a circuit equation for at least one point in the second cycle.

According to another aspect, determining the transient values for the circuit in the second cycle may include calculating transient coefficients for a transient polynomial in the second cycle.

According to another aspect, determining the cyclic-correction values for the circuit in the second cycle may include calculating cyclic-function values for interpolating a cyclic function in the second cycle.

Additional embodiments relate to an apparatus for carrying out any one of the above-described methods, where the apparatus includes a computer for executing instructions related to the method. For example, the computer may include a processor with memory for executing at least some of the instructions. Additionally or alternatively the computer may include circuitry or other specialized hardware for executing at least some of the instructions. Additional embodiments also relate to a computer-readable medium that stores (e.g., tangibly embodies) a computer program for carrying out any one of the above-described methods with a computer.

In these ways embodiments of the present invention enable improved methods for simulating circuits with cyclic behavior including circuits with widely separated spectral components.

DETAILED DESCRIPTION OF EXEMPLARY EMBODIMENTS

1. Overview

Figure 1:
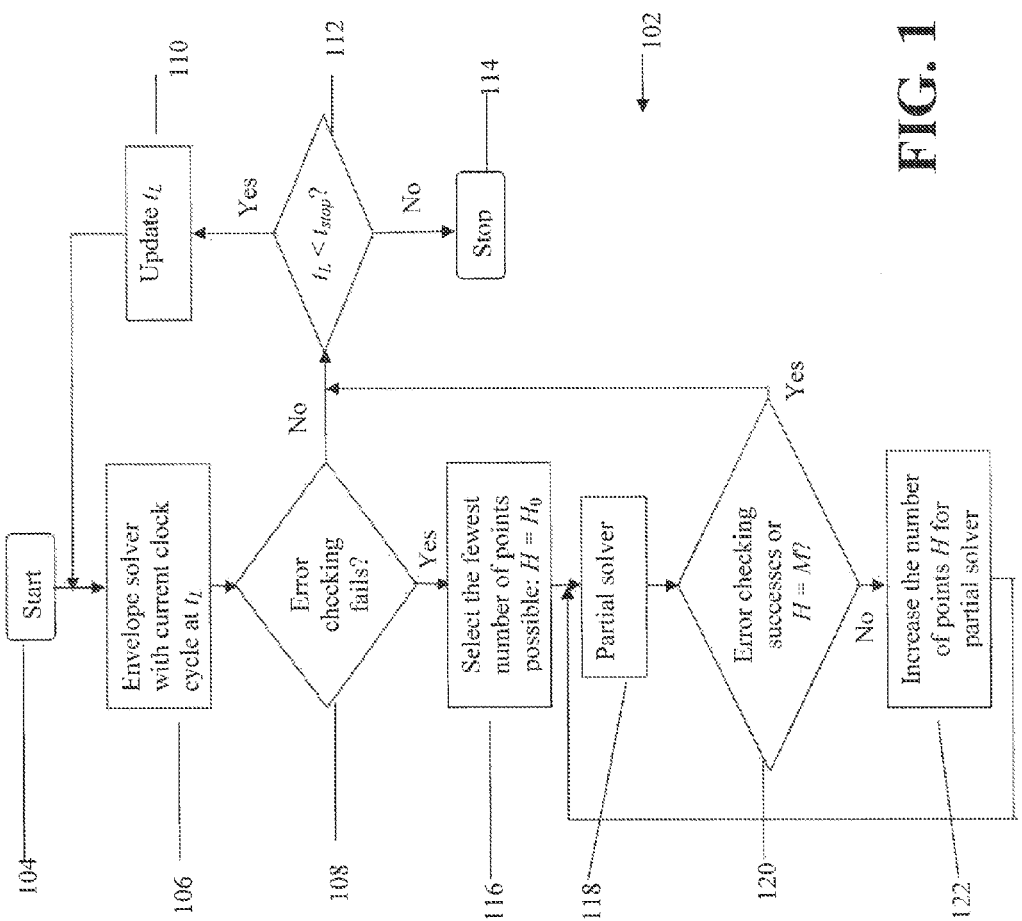
FIG. 1 shows a method of determining values for a circuit over a cycle according to an embodiment of the present invention.

An embodiment of the present invention is shown in FIG. 1. A method 102 of determining values for a circuit over a cycle begins 104 with circuit values at an initial time $t_0$, where these values typically include voltage or current values for the previous period T, which can be normalized, for example, as $T=2\pi$.

As discussed below in greater detail, the values over a period $T=2\pi$ can be represented on a uniform grid $G_{2M}=\{t_j=j\pi/M, j=1, 2, 3, \ldots, 2M\}$) of size $L=2M$. Then, one wishes to solve for values for the circuit over the next cycle ending at $t_L$, on the grid $G_{2M}$, after which the process can be repeated to the next cycle. An envelope solver is used 106 to solve for an envelope or transient solution that assumes that the cyclic (e.g., periodic) components are unchanged from the previous cycle. When this envelope is sufficiently accurate 108, the temporal variable $t_L$ can be updated to continue the process over the next cycle until a stopping time is reached 112 and the process is terminated 114.

When the envelope solution is not sufficiently accurate 108, a smaller uniform grid is used to discretize the values of the circuit 116. This grid is represented as $G_{2H}$, where $H \leq M$ and initially $H=H_0$ (e.g., $H_0=1$). A partial solver is used 118 to solve for the circuit values on the smaller grid $G_{2H}$ as a perturbation about the cyclic components on the previous cycle (e.g., by a Fourier collocation method as discussed below). When this solution is sufficiently accurate 120, the results can be accepted and the temporal variable can be advanced 112 as in the case where the envelope solution is sufficiently accurate. Alternatively the grid resolution can be increased 122 (e.g., $H \leftarrow H+1$, or $H \leftarrow 2H$) and the process can be continued until accuracy is achieved or the maximal grid size $H=M$ has been reached 120. When the process terminates at the maximal grid size $H=M$ without satisfying the accuracy requirement 120, this generally indicates that the process must be re-started 104 with a larger value of M (e.g., a higher-resolution for the cyclic behavior).

As discussed below in greater detail below, the above-described method 102 provides a robust adaptive solver for fast-envelope-following transient simulation by means of a Fourier collocation method. An adaptive partial solver 118 is introduced to bridge the gap between the envelope solver 106 and a full solver (e.g., $H=M$). The scheme advances with the fast envelope solver 106 whenever the error checking passes 108. If the error is not satisfied with envelope solver 108, the partial solver starts with the fewest selected points possible 116 (e.g., the smallest practical resolution). The selected points will be adaptively increased if necessary in order to achieve the required accuracy 122. Error checking is performed after each call to the partial solver 120. Once the error is satisfied 120, the scheme switches back to the fast envelope solver with the values of the Fourier collocation points updated by the results of partial solver. Although the number of points may be increased to the maximal size for resolving the cyclic behavior (e.g., $H=M$), this is unlikely in operational settings involving modulated circuits where the frequency of the base band signal is orders of magnitude smaller than the carrier frequency.

At least some values based on the results of the method 102 can be saved for subsequent use. For example, the results from the envelope solver 106 and the partial solver 118 can be saved directly for applications in circuit simulation. Alternatively, some derivative or summary form of the results (e.g., averages, interpolations, etc.) can be saved for later use according to the requirements of the operational setting.

2. Circuit Models

The basic circuit equation is written as:

$$\frac{dQ(v(t))}{dt} + I(v(t)) + u(t) = 0, \quad (1)$$

where $Q(v(t)) \in \Re^N$ represents contributions of the dynamic elements such as capacitors and inductors, $I(v(t)) \in \Re^N$ is the vector representing the static elements such as resistors, $u(t) \in \Re^N$ is the vector of input sources, and $v(t) \in \Re^N$ is the vector containing all the state variables such as node voltages and inductor currents. Numerical schemes are usually used to solve Eq. (1) by some discretization or finite-dimensional approximation combined with linearization method (e.g., Newton iteration) so that each linearized problem has the form $$J\Delta V = -E, \quad (2)$$

where J is the Jacobean matrix and E is the residual of the previous iteration.

3. Fourier Collocation Approximation

The interpolating trigonometric polynomial of degree M is defined as:

$$I_M q(t) = \sum_{j=1}^{2M} q(t_j) g_j(t), \quad (3)$$

where $I_M$ denotes an M-point interpolation operator. Eq. (3) is also known as a Fourier collocation approximation. Given the values of $q(t_j)$ at 2M Fourier collocation points $t_j$, $$t_j = \frac{j\pi}{M}, \quad j=1, 2, \ldots, 2M,$$

the q value at any time point t can be obtained by Eq. (3), where the periodic function $g_j(t)$ is typically defined as $$g_j(t) = \frac{1}{2M} \sin[M(t-t_j)] \cot\left[\frac{1}{2}(t-t_j)\right]. \quad (4)$$

The derivative of $$\frac{dq(t)}{dt}$$

at a Fourier collocation point $t_i$ can be directly computed by a matrix-vector multiplication as $$\left.\frac{dq(t)}{dt}\right|_{t=t_i} = (I_M q)'(t_i) = \sum_{j=1}^{2M} q(t_j) D_{ij}, \quad (5)$$

where $D_{ij}$ is calculated by $$D_{ij} = \begin{cases} \frac{1}{2}(-1)^{i+j}\cot\left(\frac{t_i - t_j}{2}\right) & i \neq j \\ 0 & i = j \end{cases} \quad (6)$$

4. Equations to be Solved

The signals of the circuit can be approximated by a low-order polynomial and a trigonometric polynomial as $$q(t) = p(t) + \sum_{j=1}^{2M} \tilde{q}_j g_j(t) \quad (7)$$

where p(t) is a low-order polynomial approximating the envelope and $\tilde{q}_j = q(t_j) - p(t_j)$ is the steady-state part of the signal.

For example, in a linear approximation p(t) has the form $$p(t) = a + bt \quad (8)$$

where the parameters a and b can be obtained through values at the known point $t_0$ and the unknown point $t_L$ (L=2M). That is, assuming that there is no constant offset in the steady-state (periodic) component (i.e., $\tilde{q}_0 = \tilde{q}_L = 0$), one can represent the solution at the endpoints $q_0 = q(t_0)$, $q_L = q(t_L)$ as $$q_0 = a + bt_0$$

$$q_L = a + bt_L. \quad (9)$$

Solving for the polynomial coefficients yields $$b = \frac{q_L - q_0}{t_L - t_0} \quad (10)$$

$$a = \frac{t_0 q_L - t_L q_0}{t_0 - t_L}$$

From Eqs. (8)-(10), one can represent time derivatives for the smooth component p(t) from state values at the endpoints (i.e., $$\frac{dp}{dt} = b).$$

Combining this with Eq. (5) the derivative of $$\frac{dq}{dt}$$

at any Fourier collocation point, for example at time point $t_L$ with L=2M, can be calculated by $$\left.\frac{dq}{dt}\right|_{t=t_L} = \left.\frac{dp}{dt}\right|_{t=t_L} + \sum_{j=1}^{L} \tilde{q}_j D_{L,j}. \quad (11)$$

It should be pointed out that although the linear approximation in Eq. (8) is satisfactory for many applications, higher order polynomial approximations are also possible, for example, by using state values at previous endpoints (e.g., $q_{-L}$, $q_{-2L}$, ...) to characterize higher-order polynomials.

5. Envelope Solver

According to the nature of modulated signals, the steady-state values at the Fourier collocation points may change very little over one cyclic interval of time. This means that all the $\tilde{q}_j$ can be considered as constant and only the envelope part p(t) is changing so that the second term in the right-hand side of Eq. (11) can be ignored. A known point $t_0$ and an unknown point $t_L$ can be used to solve Eq. (1). Substituting Eq. (11) into Eq. (1) gives $$P'_{t_L} + \sum_{j=1}^{L} \tilde{q}_j D_{Lj} + I + U = 0 \quad (12)$$

where $P'_{t_L}$ is a vector of size N containing the derivatives of envelope p(t) in Eq. (7).

Since all the $\tilde{q}_1$ are considered constant the Jacobean matrix for solving Eq. (12) is $$J = \left.\frac{dP'_{t_L}}{dV}\right|_{t=t_L} + G \quad (13)$$

where $$G = \frac{dI}{dV_L}$$

is the conductance matrix. J is an N×N matrix and hence Eq. (2) an N-dimension system which is the same size as the conventional transient simulation. This system is solved in envelope solver mode with only one unknown point required to be simulated in one clock cycle.

6. Full Solver

In full solver mode both the envelope and steady-state parts of a signal are considered changing. Applying Eq. (11) to Eq. (1) for all the collocation point gives $$P'_t + \begin{bmatrix} D_{11}I & D_{12}I & \cdots & D_{1L}I \\ D_{21}I & D_{22}I & \cdots & D_{2L}I \\ \vdots & \vdots & \vdots & \vdots \\ D_{L1}I & D_{L2}I & \cdots & D_{LL}I \end{bmatrix} \tilde{Q} + I + U = 0 \quad (14)$$

where L=2M, I is a N×N identity matrix, $P'_t$ is a vector of size N×2M containing the derivatives of envelope p(t) in Eq. (7), $\tilde{Q}$ is a vector of size N×2M containing all the in Eq. (7), I and U are both vectors of size N×2M containing the contributions from static components and independent sources, respectively.

The Jacobean matrix for solving Eq. (14) is $$J = \frac{dP'_t}{dV} + \begin{bmatrix} D_{11}\tilde{C}_1 & D_{12}\tilde{C}_2 & \cdots & D_{1L}\tilde{C}_L \\ D_{21}\tilde{C}_1 & D_{22}\tilde{C}_2 & \cdots & D_{2L}\tilde{C}_L \\ \vdots & \vdots & \vdots & \vdots \\ D_{L1}\tilde{C}_1 & D_{L2}\tilde{C}_2 & \cdots & D_{LL}\tilde{C}_L \end{bmatrix} + G \quad (15)$$

where $$\tilde{C}_j = \frac{d\tilde{Q}_j}{dV_j}$$

is the capacitance matrix. J is an (N×2M)×(N×2M) matrix and hence Eq. (15) an (N×2M)-dimension system to be solved by the full solver.

7. Partial Solver

By introducing an intermediate term the circuit signals in the partial solver are expressed as $$q(t) = p(t) + \sum_{j=1}^{2M} \tilde{q}_j g_j^1(t) + \sum_{k=1}^{2H} \hat{q}_k g_k^2(t) \quad (16)$$

where 2H≦2M is the number of points selected for partial solve. The collocation values $\tilde{q}_j$, j=1, 2, . . . , 2M, are the steady-state values of the Fourier collocation points in the previous clock cycle. The collocation values $\hat{q}_k$, k=1, . . . , 2H, are the differences between the steady-state values of the Fourier collocation points selected in the current clock cycle and the corresponding values in the previous cycle, i.e., $$\hat{q}_k = \tilde{q}(\hat{t}_k) - \tilde{q}(\hat{t}_k - T) \quad (17)$$

where T is the period of clock and $\hat{t}_k$ (k=1, . . . 2H) are the collocation points for the partial solver.

Applying Eq. (16) to Eq. (1) for all the collocation point selected for the partial solver gives $$P'_t + \begin{bmatrix} \tilde{D}_{11}I & \tilde{D}_{12}I & \cdots & \tilde{D}_{1L}I \\ \tilde{D}_{21}I & \tilde{D}_{22}I & \cdots & \tilde{D}_{2L}I \\ \vdots & \vdots & \vdots & \vdots \\ \tilde{D}_{F1}I & \tilde{D}_{F2}I & \cdots & \tilde{D}_{FL}I \end{bmatrix} \tilde{Q} + \begin{bmatrix} \hat{D}_{11}I & \hat{D}_{12}I & \cdots & \hat{D}_{1F}I \\ \hat{D}_{21}I & \hat{D}_{22}I & \cdots & \hat{D}_{2F}I \\ \vdots & \vdots & \vdots & \vdots \\ \hat{D}_{F1}I & \hat{D}_{F2}I & \cdots & \hat{D}_{FF}I \end{bmatrix} \hat{Q} + I + U = 0 \quad (18)$$

where F=2H. The Jacobean matrix for solving Eq. (18) is $$J = \frac{dP'_t}{dV} + \begin{bmatrix} \hat{D}_{11}\hat{C}_1 & \hat{D}_{12}\hat{C}_2 & \cdots & \hat{D}_{1F}\hat{C}_F \\ \hat{D}_{21}\hat{C}_1 & \hat{D}_{22}\hat{C}_2 & \cdots & \hat{D}_{2F}\hat{C}_F \\ \vdots & \vdots & \vdots & \vdots \\ \hat{D}_{F1}\hat{C}_1 & \hat{D}_{F2}\hat{C}_1 & \cdots & \hat{D}_{FF}\hat{C}_F \end{bmatrix} + G. \quad (19)$$

The matrix J is an (N×2H)×(N×2H) matrix and hence Eq. (19) an (N×2H)-dimension system to be solved by the partial solver. By comparing Eq. (15) with Eq. (19) it is clear that the dimension of the system to be solved has been reduced from N×2M for the full solver to N×2H for the partial solver, which will significantly reduce the simulation time when H is small.

Since the Fourier collocation differential matrix D (Eq. (6)) is a full matrix, the linear system that needs to be solved during Newton iteration is less-sparse, a condition which results in difficulties in large-scale circuit simulation. Matrix-implicit Krylov subspace methods, such as GMRES (Generalized Minimal Residual) and QMR (Quasi-Minimal Residual) are commonly used to solve such problems. When using GMRES, an effective preconditioner is often critical to the convergence of the matrix iteration. For example, according to one approach, a Schur decomposition of the Fourier collocation differential matrix provides an effective preconditioner for circuit simulations [9].

8. Error Estimation

Error estimation for the envelope solver 108 and the partial solver 120 correspond to evaluating the circuit equation Eq. (1) at one or more points that were not used to generate the solutions. That is, once the state variables v(t) are determined at the collocation points, Eq. (1) can be evaluated using the expressions in Eq. (7) or Eq. (16).

The method 102 provides a robust adaptive solve scheme for a fast envelope following transient simulation using the Fourier collocation method. It applies a fast envelope solver, a more accurate partial pseudo-spectral solver, and the most accurate full pseudo-spectral solver adaptively. The fastest speed is obtained by the fast envelope solver which solves one time point in one clock cycle. The accuracy is guaranteed by the full solver which takes into account the effects of all the sample points in one clock cycle. The transient between the envelope solver and full solver is bridged by the partial solver which solves some selected sample points adaptively. All three solvers are based on Fourier collocation pseudo-spectral technology. In this way, the method 102 significantly improves the efficiency of fast envelope following transient simulation under the requirements of high accuracy.

9. Specific Embodiments

In the following specific implementations of the above-described method 102, the fast envelope following transient simulation advances with the fast envelope solver whenever the error checking passes 108. If the error is not satisfied with the envelope solver, the partial solver starts with the fewest selected points possible 116. Error checking is performed after each partial solve 120. If the error is satisfied, the envelope solver is resumed with the steady-state values of Fourier collocation points updated by the solution of partial solver 106. Otherwise, the partial solver is continued with the number of selected points increased adaptively 122. This process is continued until the number of selected points equals the number of points used by the full solver, whereby the partial solver becomes a full solver.

Figure 2:
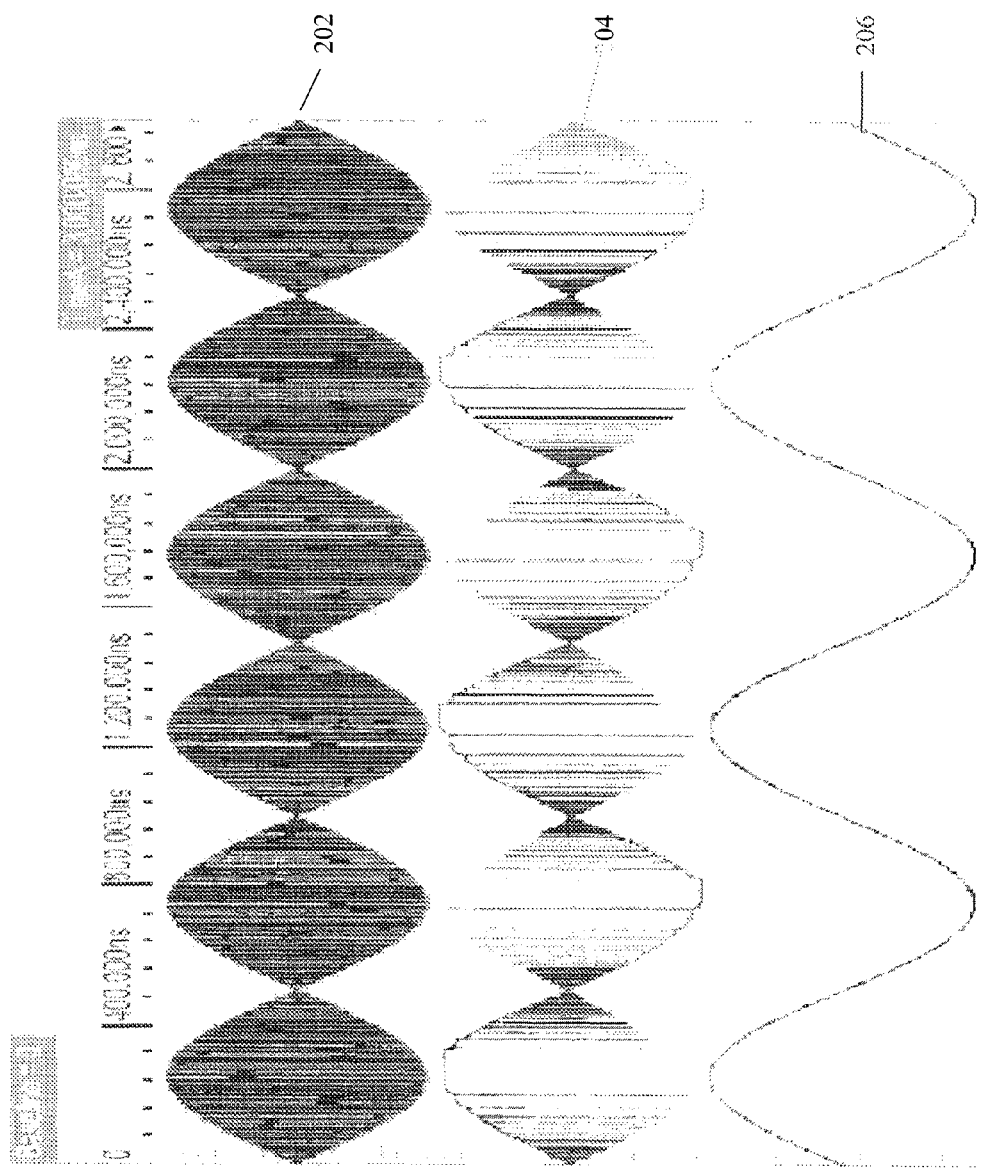
FIG. 2 shows waveforms from an exemplary amplitude modulation circuit for an embodiment of the present invention.
Figure 3:
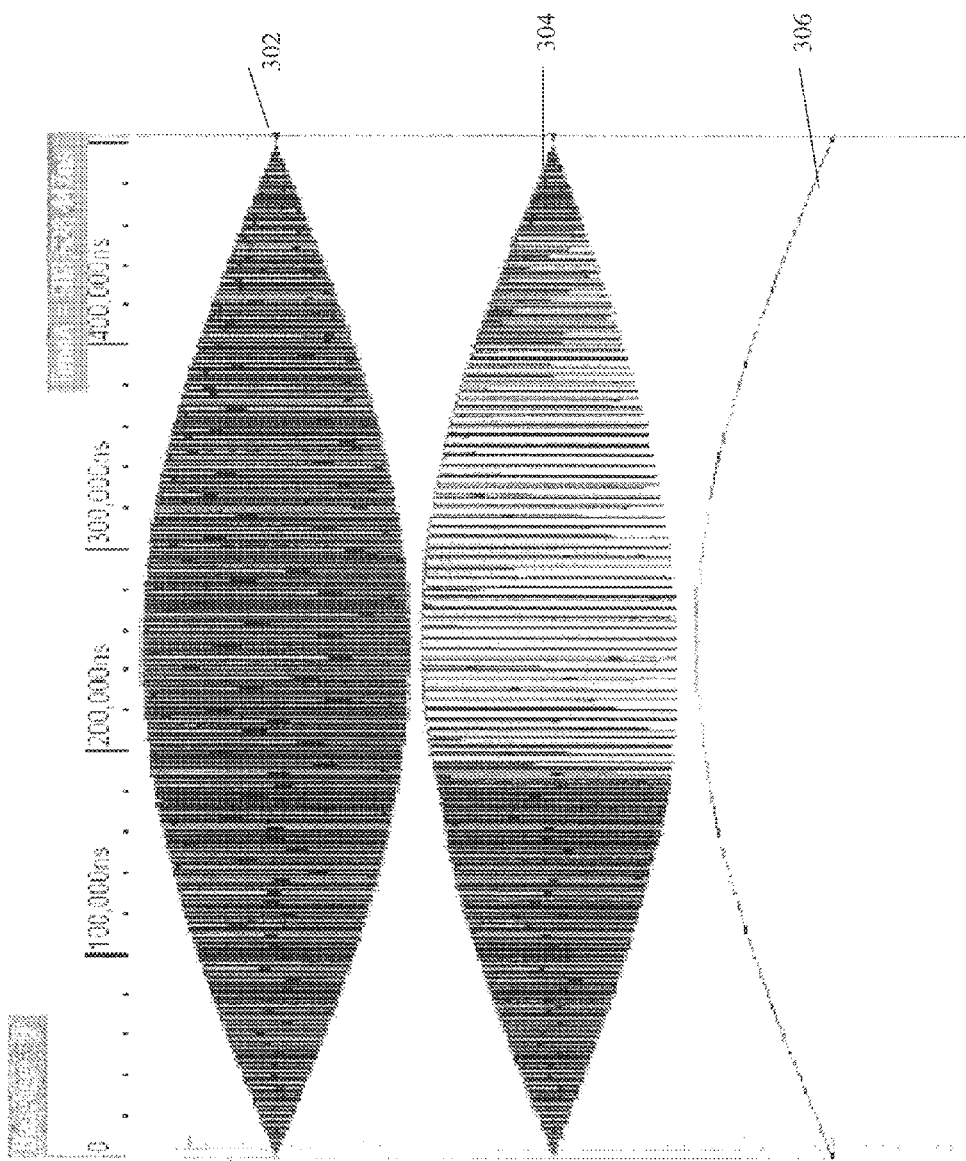
FIG. 3 shows waveforms from an exemplary amplitude modulation circuit for an embodiment of the present invention.

FIGS. 2 and 3 show simulation results for a simple amplitude modulation circuit. The conventional transient analysis for this circuit took 5.84 seconds. The envelope simulations were performed with two simulation speed settings: env_speed=3 and env_speed=2, where the higher the speed setting the faster the simulation but the less accurate the results. The adaptive method 102 based on a partial solver 118 was compared with an envelope-full solver that effectively sets H=M in the method 102. That is, if the envelope error checking fails 108, a full solver is implemented (e.g., setting H=M initially 116).

FIG. 2 shows the results for simulation speed setting env_speed=3 including the results from a conventional transient solver that integrates the solution with a sufficiently small time step to resolve all frequencies 202, the envelope-full solver 204 and the adaptive partial solver 206. In this case the envelope-full solver took 1.69 seconds which is about 3.5× speed up compared to the conventional transient analysis. The adaptive partial solver took only 0.58 second which is about 10× speed up compared to the conventional transient analysis and about 3× speed up compared to the envelope-full solver. One can see from FIG. 2 that there are a large number of full solves required in the envelope-full solver approach 204 in order to satisfy the accuracy requirement while in the adaptive solver approach 206 most errors in the envelope solver were corrected by the partial solver and very few full-solver operations were needed.

FIG. 3 shows the results for simulation speed setting env_speed=2 including the results from the conventional solver 302, the envelope-full solver 304 and the adaptive partial solver 306. In this case the envelope-full solver approach took about 6 seconds which is even slower than the conventional transient analysis due to the overhead of frequent switches between the envelope solver and the full solver and the fact that very few cycles could pass the error checking with the envelope solver alone. This is clearly shown in FIG. 3. The adaptive partial solver approach took 0.58 second which is the same time as env_speed=3 due to the successful partial solver.

Figure 4:
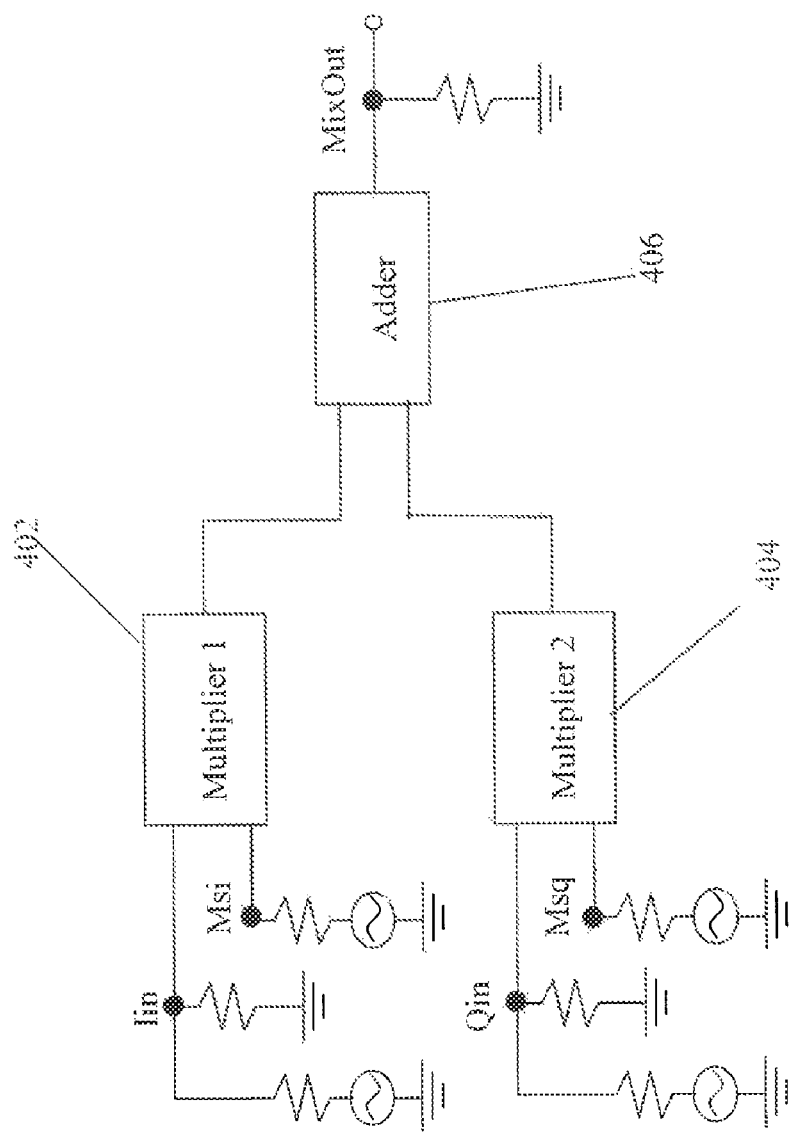
FIG. 4 shows an exemplary CDMA circuit that is directed to an embodiment of the present invention.
Figure 5:
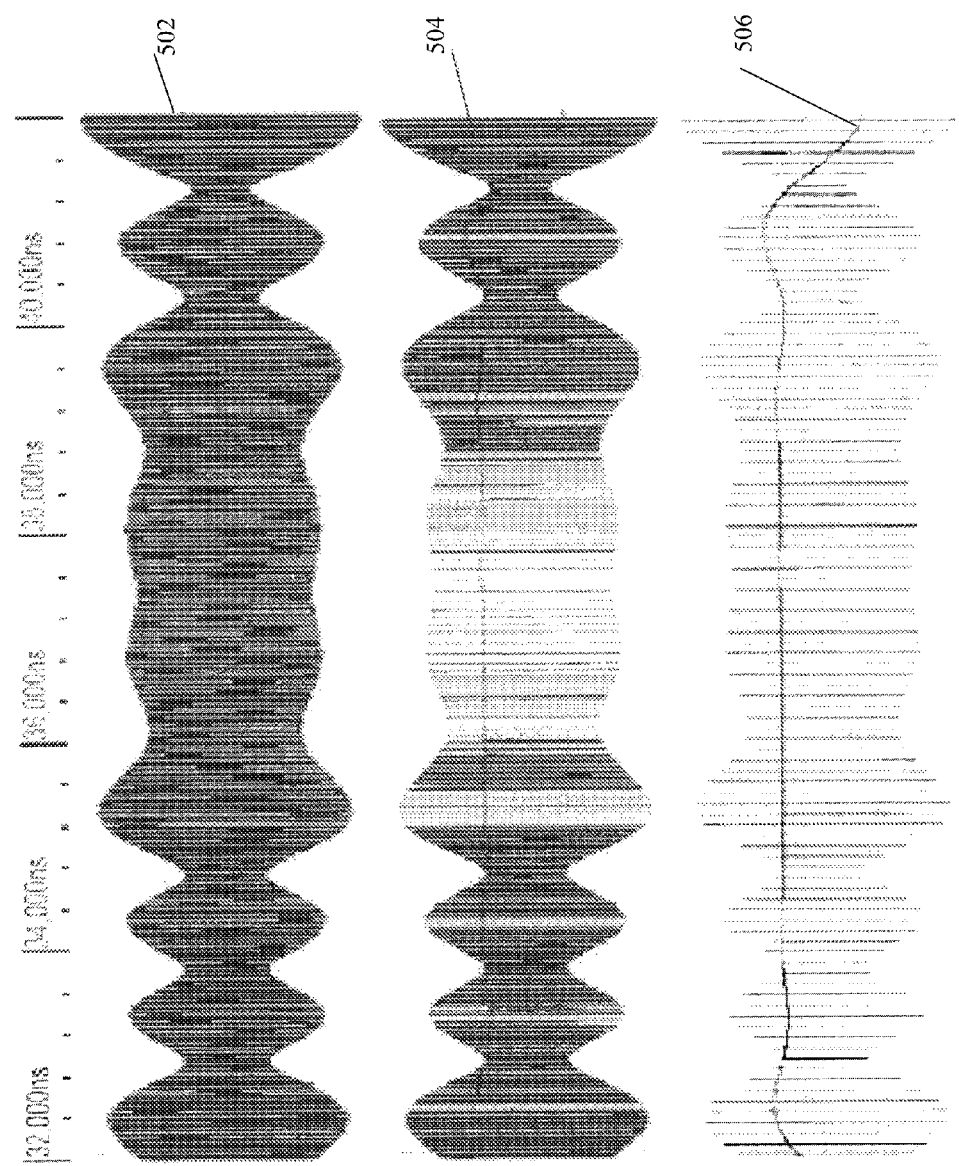
FIG. 5 shows waveforms related to the CDMA circuit of FIG. 4 for an embodiment of the present invention

FIGS. 4 and 5 show an example from a CDMA (Code Division Multiple Access) circuit. FIG. 4 shows two multipliers 402, 404 and an adder 406 from a CDMA circuit. The 1 channel signal and a sinusoidal source (carrier) with 90 degree phase shift are inputted into the first multiplier 402. The Q channel signal and a sinusoidal source (carrier) are inputted into the second multiplier 404. The two modulated signals output from the first and second multipliers 402, 404 are combined in the adder 406.

FIG. 5 shows the results for simulation speed setting env_speed=2 including the results from the conventional solver 502, the envelope-full solver 504 and the adaptive partial solver 506 as measured at the output of the adder 406. The conventional solver 502 took about 113 seconds. The envelope-full solver 504 took about 60 seconds. The adaptive partial solver 506 took about 18 seconds.

10. Additional Embodiments

Figure 6:
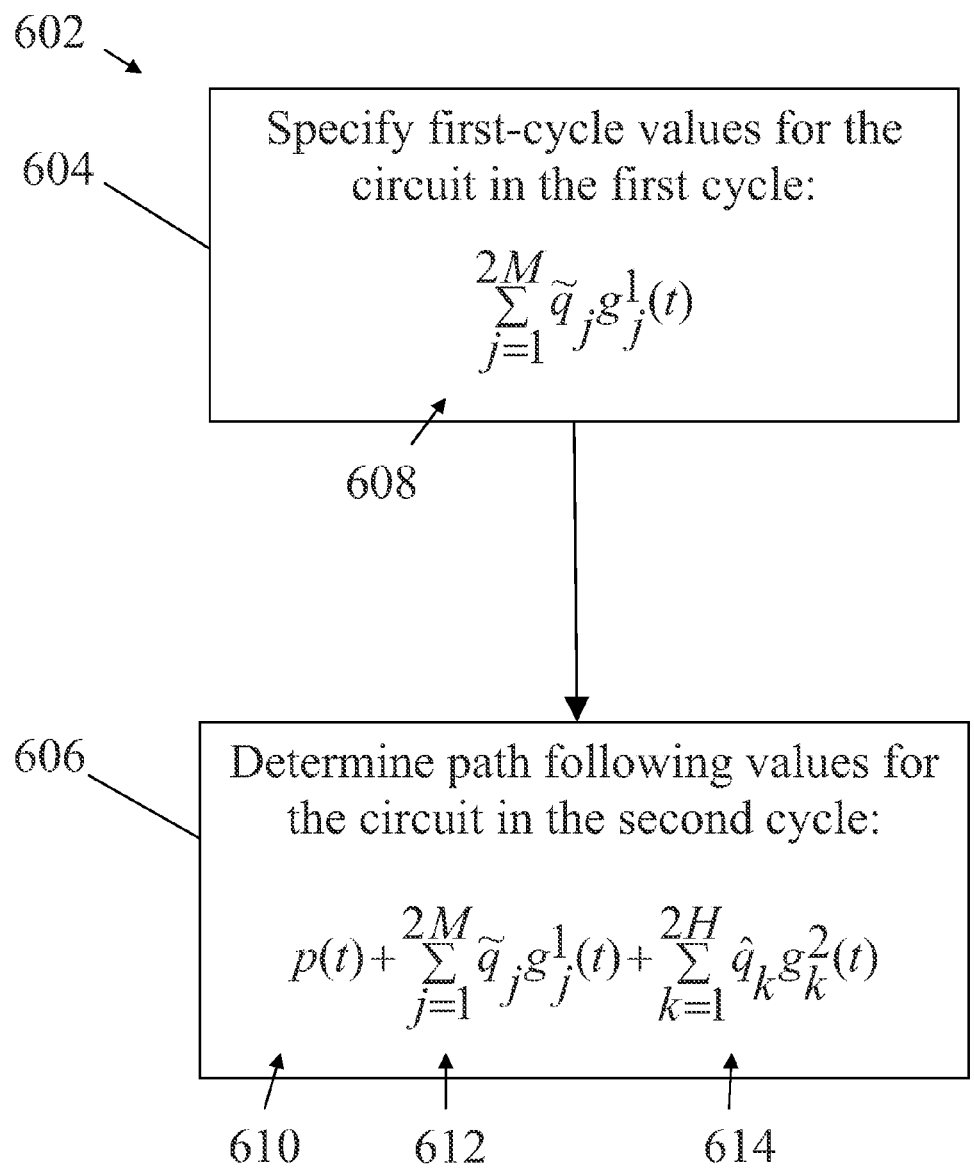
FIG. 6 shows a method of determining values for a circuit over a cycle according to an embodiment of the present invention.

With reference to Eq. (16), FIG. 6 shows a method 602 of determining values for a circuit over a cycle according to an embodiment of the present invention. The method 602 includes specifying first-cycle values for the circuit in a first cycle 604, where the first-cycle values include voltage or current values for the circuit and provide reference cyclic values 608 for characterizing a cyclic behavior of the circuit in the first cycle. A reference cyclic dimension corresponds to the grid size for characterizing the cyclic behavior of the circuit in the first cycle. As discussed above (e.g., paragraphs 20 and 25) the grid size for characterizing the cyclic behavior of the circuit corresponds to the number of terms in the summation (i.e., 2M in this case).

The method 602 then includes determining, from the first-cycle values, path-following values for the circuit in a second cycle 606, where the path-following values include transient values 610 for characterizing a transient behavior of the circuit and cyclic-correction values 614 for characterizing the cyclic behavior of the circuit relative to the reference cyclic values 612 from the first cycle. Similarly as above, a cyclic-correction dimension corresponds to the grid size for characterizing the cyclic behavior of the circuit relative to the reference cyclic values from the first cycle (i.e., 2H in this case). As illustrated in FIG. 1 above, the cyclic-correction dimension is desirably smaller than the reference cyclic dimension (i.e., 2H<2M in this case).

Additional embodiments relate to an apparatus for carrying out any one of the above-described methods, where the apparatus includes a computer for executing computer instructions related to the method. In this context the computer may be a general-purpose computer including, for example, a processor, memory, storage, and input/output devices (e.g., monitor, keyboard, disk drive, Internet connection, etc.). However, the computer may include circuitry or other specialized hardware for carrying out some or all aspects of the method. In some operational settings, the apparatus may be configured as a system that includes one or more units, each of which is configured to carry out some aspects of the method either in software, in hardware or in some combination thereof.

At least some values based on the results of the method can be saved, either in memory (e.g., RAM (Random Access Memory)) or permanent storage (e.g., a hard-disk system) for later use.

Additional embodiments also relate to a computer-readable medium that stores (e.g., tangibly embodies) a computer program for carrying out any one of the above-described methods by means of a computer. The computer program may be written, for example, in a general-purpose programming language (e.g., C, C++) or some specialized application-specific language. The computer program may be stored as an encoded file in some useful format (e.g., binary, ASCII).

Although only certain exemplary embodiments of this invention have been described in detail above, those skilled in the art will readily appreciate that many modifications are possible in the exemplary embodiments without materially departing from the novel teachings and advantages of this invention. For example, aspects of embodiments disclosed above can be combined in other combinations to form additional embodiments. Accordingly, all such modifications are intended to be included within the scope of this invention.

11. References

The following references are related to the disclosed subject matter:

[1] Mayaram, K. M., Lee, D. C., Moinian, S., Rich, D. A. and Roychowdhury J., "Computer-Aided Circuit Analysis Tools for RFIC Simulation: Algorithms, Features, and Limitations," IEEE Trans. Circuits and Systems, Vol. 47, April 2000, pp. 274-286.

[2] Kundert, K. S., "Introduction to RF simulation and Its Application," IEEE J. Solid-State Circuits, Vol. 34, September 1999, pp. 1298-1319.

[3] Passinsky, A. and Veremey, V., "Envelope Transient Analysis: Key to First-Pass Successful Wireless Systems and IC Design," Wireless Symposium, Spring, 2000.

[4] Sharrit, D., "New Method of Analysis of Communication Systems," Proc. MTTS'96 WMFA: Nonlinear CAD Workshop, June, 1996.

[5] Rizzoli, V., Neri, A. and Mastri, F., "A Modulation-Oriented Piecewise Harmonic-Balance Technique Suitable for Transient Analysis and Digitally Modulated Signals," Proc. 26th Microwave Conf., Prague, Czech Republic, September, 1996. pp. 546-550.

[6] Feldmann, P. and Roychowdhury, J., "Computation of Circuit Waveform Envelopes Using an Efficient, Matrix-Decomposed Harmonic Balance Algorithm", IEEE Int. Conf. Computer-Aided Design Dig. Tech. Papers, November, 1996.

[7] Petzold, L., "An Efficient Numerical Method for Highly Oscillatory Ordinary Differential Equations", SIAM J. Numer. Anal., Vol. 18, pp. 455-479, June 1981.

[8] Kundert, K., White, J. and Sangiovanni-Vincentelli, A., "An Envelope-Following Method for the Efficient Transient Simulation of Switching Power and Filter Circuits", IEEE Int. Conf. Computer-Aided Design Dig. Tech. Papers, November, 1998.

[9] Yang, B. and Phillips, J., "A Multi-Interval Chebyshev Collocation Method for Efficient High-Accuracy RF Circuit Simulation", Proc. 37th Design Automation Conf., June 2000, pp. 178-183.

What is claimed is:

1. A method of determining values for a circuit over a cycle, comprising:
   specifying first-cycle values for the circuit in a first cycle of a period that characterizes a cyclic behavior of the circuit in time, the first-cycle values including voltage or current values for the circuit and providing reference cyclic values for characterizing the cyclic behavior of the circuit in the first cycle with a reference cyclic dimension that corresponds to a first grid size for characterizing on a first grid the cyclic behavior of the circuit in the first cycle;
   determining, from the first-cycle values, path-following values for the circuit in a second cycle of the period following the first cycle, the path-following values including transient values for characterizing a transient behavior of the circuit in the second cycle by specifying a transient polynomial in the second cycle and cyclic-correction values for characterizing the cyclic behavior of the circuit in the second cycle relative to the reference cyclic values from the first cycle, wherein a cyclic-correction dimension of the cyclic-correction values corresponds to a second grid size for characterizing on a second grid the cyclic behavior of the circuit in the second cycle relative to the reference cyclic values from the first cycle, the cyclic-correction dimension being greater than zero and less than the reference cyclic dimension; and
   saving at least some values based on the path-following values in the second cycle.

2. The method of claim 1, further comprising:
   determining, from the first-cycle values in the first cycle, envelope values for the circuit in the second cycle, the envelope values characterizing the transient behavior of the circuit in the second cycle relative to the reference cyclic values from the first cycle, wherein the envelope values characterize the transient behavior of the circuit in the second cycle by specifying a second transient polynomial in the second cycle; and
   estimating an accuracy of the envelope values and specifying the cyclic-correction dimension for improved accuracy of the path-following values relative to the envelope values in the second cycle.

3. The method of claim 1, wherein the path-following values are first path-following values, the transient values are first transient values, the cyclic-correction values are first cyclic-correction values, and the cyclic-correction dimension is a first cyclic-correction dimension, and the method further comprises:
   estimating an accuracy of the first path-following values and specifying a second cyclic-correction dimension for corresponding second cyclic-correction values, the second cyclic-correction dimension being greater than the first cyclic-correction dimension for an improved accuracy in the second cycle; and
   determining, from the first-cycle values, second path-following values for the circuit in the second cycle, the second path-following values including second transient values for characterizing the transient behavior of the circuit in the second cycle and the second cyclic-correction values for characterizing the cyclic behavior of the circuit in the second cycle relative to the reference cyclic values from the first cycle.

4. The method of claim 1, further comprising: a step for specifying the cyclic-correction dimension to improve an accuracy of the path-following values in the second cycle relative to an envelope approximation that is based on the reference cyclic values from the first cycle, the envelope approximation characterizing the transient behavior of the circuit in the second cycle relative to the reference cyclic values from the first cycle.

5. The method of claim 1, further comprising: estimating an accuracy of the path-following values in the second cycle by calculating an error in a circuit equation for at least one point in the second cycle.

6. The method of claim 1, wherein determining the transient values for the circuit in the second cycle includes calculating transient coefficients for the transient polynomial in the second cycle by evaluating the transient polynomial at endpoint time values that are separated by one or more values of the period.

7. The method of claim 1, wherein determining the cyclic-correction values for the circuit in the second cycle includes calculating cyclic-function values for interpolating a cyclic function in the second cycle from the cyclic-function values on the second grid.

8. An apparatus for determining values for a circuit over a cycle, the apparatus comprising a computer for executing computer instructions, wherein the computer includes computer instructions for:
   specifying first-cycle values for the circuit in a first cycle of a period that characterizes a cyclic behavior of the circuit in time, the first-cycle values including voltage or current values for the circuit and providing reference cyclic values for characterizing the cyclic behavior of the circuit in the first cycle with a reference cyclic dimension that corresponds to a first grid size for characterizing on a first grid the cyclic behavior of the circuit in the first cycle;
   determining, from the first-cycle values, path-following values for the circuit in a second cycle of the period following the first cycle, the path-following values including transient values for characterizing a transient behavior of the circuit in the second cycle by specifying a transient polynomial in the second cycle and cyclic-correction values for characterizing the cyclic behavior of the circuit in the second cycle relative to the reference cyclic values from the first cycle, wherein a cyclic-correction dimension of the cyclic-correction values corresponds to a second grid size for characterizing on a second grid the cyclic behavior of the circuit in the second cycle relative to the reference cyclic values from the first cycle, the cyclic-correction dimension being greater than zero and less than the reference cyclic dimension; and saving at least some values based on the path-following values in the second cycle.

9. The apparatus of claim 8, wherein the computer further includes computer instructions for:

determining, from the first-cycle values in the first cycle, envelope values for the circuit in the second cycle, the envelope values characterizing the transient behavior of the circuit in the second cycle relative to the reference cyclic values from the first cycle, wherein the envelope values characterize the transient behavior of the circuit in the second cycle by specifying a second transient polynomial in the second cycle; and estimating an accuracy of the envelope values and specifying the cyclic-correction dimension for improved accuracy of the path-following values relative to the envelope values in the second cycle.

10. The apparatus of claim 8, wherein the path-following values are first path-following values, the transient values are first transient values, the cyclic-correction values are first cyclic-correction values, and the cyclic-correction dimension is a first cyclic-correction dimension, and the computer further includes computer instructions for:

estimating an accuracy of the first path-following values and specifying a second cyclic-correction dimension for corresponding second cyclic-correction values, the second cyclic-correction dimension being greater than the first cyclic-correction dimension for an improved accuracy in the second cycle; and determining, from the first-cycle values, second path-following values for the circuit in the second cycle, the second path-following values including second transient values for characterizing the transient behavior of the circuit in the second cycle and the second cyclic-correction values for characterizing the cyclic behavior of the circuit in the second cycle relative to the reference cyclic values from the first cycle.

11. The apparatus of claim 8, wherein the computer further includes: means for specifying the cyclic-correction dimension to improve an accuracy of the path-following values in the second cycle relative to an envelope approximation that is based on the reference cyclic values from the first cycle, the envelope approximation characterizing the transient behavior of the circuit in the second cycle relative to the reference cyclic values from the first cycle.

12. The apparatus of claim 8, wherein the computer further includes computer instructions for: estimating an accuracy of the path-following values in the second cycle by calculating an error in a circuit equation for at least one point in the second cycle.

13. The apparatus of claim 8, wherein determining the transient values for the circuit in the second cycle includes calculating transient coefficients for the transient polynomial in the second cycle by evaluating the transient polynomial at endpoint time values that are separated by one or more values of the period.

14. The apparatus of claim 8, wherein determining the cyclic-correction values for the circuit in the second cycle includes calculating cyclic-function values for interpolating a cyclic function in the second cycle from the cyclic-function values on the second grid.

15. The apparatus of claim 8, wherein the computer includes a processor with memory for executing at least some of the computer instructions.

16. The apparatus of claim 8, wherein the computer includes circuitry for executing at least some of the computer instructions.

17. A computer-readable medium that stores a computer program for determining values for a circuit over a cycle wherein the computer program includes instructions for:

specifying first-cycle values for the circuit in a first cycle of a period that characterizes a cyclic behavior of the circuit in time, the first-cycle values including voltage or current values for the circuit and providing reference cyclic values for characterizing the cyclic behavior of the circuit in the first cycle with a reference cyclic dimension that corresponds to a first grid size for characterizing on a first grid the cyclic behavior of the circuit in the first cycle;

determining, from the first-cycle values, path-following values for the circuit in a second cycle of the period following the first cycle, the path-following values including transient values for characterizing a transient behavior of the circuit in the second cycle by specifying a transient polynomial in the second cycle and cyclic-correction values for characterizing the cyclic behavior of the circuit in the second cycle relative to the reference cyclic values from the first cycle, wherein a cyclic-correction dimension of the cyclic-correction values corresponds to a second grid size for characterizing on a second grid the cyclic behavior of the circuit in the second cycle relative to the reference cyclic values from the first cycle, the cyclic-correction dimension being greater than zero and less than the reference cyclic dimension; and saving at least some values based on the path-following values in the second cycle.

18. The computer-readable medium of claim 17, wherein the computer program further includes instructions for determining, from the first-cycle values in the first cycle, envelope values for the circuit in the second cycle, the envelope values characterizing the transient behavior of the circuit in the second cycle relative to the reference cyclic values from the first cycle, wherein the envelope values characterize the transient behavior of the circuit in the second cycle by specifying a second transient polynomial in the second cycle; and estimating an accuracy of the envelope values and specifying the cyclic-correction dimension for improved accuracy of the path-following values relative to the envelope values in the second cycle.

19. The computer-readable medium of claim 17, wherein the path-following values are first path-following values, the transient values are first transient values, the cyclic-correction values are first cyclic-correction values, and the cyclic-correction dimension is a first cyclic-correction dimension, and the computer program further includes instructions for:

estimating an accuracy of the first path-following values and specifying a second cyclic-correction dimension for corresponding second cyclic-correction values, the second cyclic-correction dimension being greater than the first cyclic-correction dimension for an improved accuracy in the second cycle; and determining, from the first-cycle values, second path-following values for the circuit in the second cycle, the second path-following values including second transient values for characterizing the transient behavior of the circuit in the second cycle and the second cyclic-correction values for characterizing the cyclic behavior of the circuit in the second cycle relative to the reference cyclic values from the first cycle.

20. The computer-readable medium of claim 17, wherein the computer program further includes instructions for: a step for specifying the cyclic-correction dimension to improve an accuracy of the path-following values in the second cycle relative to an envelope approximation that is based on the reference cyclic values from the first cycle, the envelope approximation characterizing the transient behavior of the circuit in the second cycle relative to the reference cyclic values from the first cycle.

21. The computer-readable medium of claim 17, wherein the computer program further includes instructions for: estimating an accuracy of the path-following values in the second cycle by calculating an error in a circuit equation for at least one point in the second cycle.

22. The computer-readable medium of claim 17, wherein determining the transient values for the circuit in the second cycle includes calculating transient coefficients for the transient polynomial in the second cycle by evaluating the transient polynomial at endpoint time values that are separated by one or more values of the period.

23. The computer-readable medium of claim 17, wherein determining the cyclic-correction values for the circuit in the second cycle includes calculating cyclic-function values for interpolating a cyclic function in the second cycle from the cyclic-function values on the second grid.

* * * * *

UNITED STATES PATENT AND TRADEMARK OFFICE
CERTIFICATE OF CORRECTION

| | | |
|---|---|---|
| PATENT NO. | : 8,200,467 B1 | Page 1 of 2 |
| APPLICATION NO. | : 11/756410 | |
| DATED | : June 12, 2012 | |
| INVENTOR(S) | : Cai et al. | |

It is certified that error appears in the above-identified patent and that said Letters Patent is hereby corrected as shown below:

On the title page, under "Other Publications", in column 1, line 7, delete "81 Issue 11 21 pages." and insert --81, Issue 11-21 pages.--, therefor.

On the title page, under "Other Publications", in column 2, line 8, after "Passinsky," delete "A." and insert --A.,--, therefor.

Title page 2, under "Other Publications", in column 1, line 1, after "Feldman," delete "P." and insert --P.,--, therefor.

Title page 2, under "Other Publications", in column 2, line 1, after "Kundert," delete "K." and insert --K.,--, therefor.

Title page 2, under "Other Publications", in column 2, line 4, after "Yang," delete "B." and insert --B.,--, therefor.

In column 2, line 64, after "invention" insert --.--, therefor.

In column 3, line 21, delete "$H \leqq M$" and insert --$H \leq M$--, therefor.

In column 7, line 35, delete "$2H \leqq 2M$" and insert --$2H \leq 2M$--, therefor.

In column 8, line 35, delete "Eq," and insert --Eq.--, therefor.

In column 9, line 43, delete "1" and insert --I--, therefor.

In column 12, line 1, in Claim 4, after "comprising:" insert --¶--, therefor.

In column 12, line 1, in Claim 5, after "comprising:" insert --¶--, therefor.

Signed and Sealed this
Twenty-fifth Day of September, 2012

David J. Kappos
*Director of the United States Patent and Trademark Office*

CERTIFICATE OF CORRECTION (continued)
U.S. Pat. No. 8,200,467 B1

In column 13, line 2, in Claim 12, after "for:" insert --¶--, therefor.

In column 14, line 2, in Claim 18, after "for" insert --:--, therefor.

In column 15, line 2, in Claim 20, after "for:" insert --¶--, therefor.

In column 15, line 2, in Claim 21, after "for:" insert --¶--, therefor.

UNITED STATES PATENT AND TRADEMARK OFFICE
CERTIFICATE OF CORRECTION

| | |
|---|---|
| PATENT NO. | : 8,200,467 B1 |
| APPLICATION NO. | : 11/756410 |
| DATED | : June 12, 2012 |
| INVENTOR(S) | : Cai et al. |

It is certified that error appears in the above-identified patent and that said Letters Patent is hereby corrected as shown below:

On the title page, under "Other Publications", in column 1, line 7, delete "81 Issue 11 21 pages." and insert --81, Issue 11-21 pages.--, therefor.

On the title page, under "Other Publications", in column 2, line 8, after "Passinsky," delete "A." and insert --A.,--, therefor.

Title page 2, under "Other Publications", in column 1, line 1, after "Feldman," delete "P." and insert --P.,--, therefor.

Title page 2, under "Other Publications", in column 2, line 1, after "Kundert," delete "K." and insert --K.,--, therefor.

Title page 2, under "Other Publications", in column 2, line 4, after "Yang," delete "B." and insert --B.,--, therefor.

In column 2, line 64, after "invention" insert --.--, therefor.

In column 3, line 21, delete "H$\leqq$M" and insert --H$\leq$M--, therefor.

In column 7, line 35, delete "2H$\leqq$2M" and insert --$2H \leq 2M$--, therefor.

In column 8, line 35, delete "Eq," and insert --Eq.--, therefor.

In column 9, line 43, delete "1" and insert --I--, therefor.

This certificate supersedes the Certificate of Correction issued September 25, 2012.

Signed and Sealed this
Thirtieth Day of October, 2012

David J. Kappos
*Director of the United States Patent and Trademark Office*

CERTIFICATE OF CORRECTION (continued)
U.S. Pat. No. 8,200,467 B1

In column 12, line 25 (Claim 4, line 1), after "comprising:" insert --¶--, therefor.

In column 12, line 33 (Claim 5, line 1), after "comprising:" insert --¶--, therefor.

In column 13, line 56 (Claim 12, line 2), after "for:" insert --¶--, therefor.

In column 14, line 41 (Claim 18, line 2), after "for" insert --:--, therefor.

In column 15, line 8 (Claim 20, line 2), after "for:" insert --¶--, therefor.

In column 15, line 17 (Claim 21, line 2), after "for:" insert --¶--, therefor.